(12) United States Patent
Karp (10) Patent No.: US 8,947,839 B2
(45) Date of Patent: Feb. 3, 2015

(54) ENHANCED IMMUNITY FROM ELECTROSTATIC DISCHARGE

(75) Inventor: James Karp, Saratoga, CA (US)

(73) Assignee: Xilinx, Inc., San Jose, CA (US)

(*) Notice: Subject to any disclaimer, the term of this patent is extended or adjusted under 35 U.S.C. 154(b) by 1529 days.

(21) Appl. No.: 12/512,441

(22) Filed: Jul. 30, 2009

(65) Prior Publication Data

US 2011/0026173 A1 Feb. 3, 2011

(51) Int. Cl.
*H02H 9/04* (2006.01)
*H03K 19/003* (2006.01)
*H01L 27/02* (2006.01)
*H03K 17/081* (2006.01)

(52) U.S. Cl.
CPC ...... *H03K 19/00361* (2013.01); *H01L 27/0266* (2013.01); *H03K 17/08104* (2013.01)
USPC .......................................................... 361/56

(58) Field of Classification Search
CPC ............ H01L 27/0266; H01L 27/0251; H01L 27/0255; H01L 27/0262; H02H 9/046; H03K 17/08104; H03K 19/00361
USPC .......................................................... 361/56
See application file for complete search history.

(56) References Cited

U.S. PATENT DOCUMENTS

| 5,623,387 | A | 4/1997 | Li et al. |
| 5,793,588 | A * | 8/1998 | Jeong ............................. 361/56 |
| 6,208,494 | B1 * | 3/2001 | Nakura et al. .................. 361/56 |
| 6,385,021 | B1 * | 5/2002 | Takeda et al. ................... 361/56 |
| 7,250,660 | B1 | 7/2007 | Huang et al. |
| 2007/0121263 | A1 | 5/2007 | Liu et al. |
| 2009/0067104 | A1 * | 3/2009 | Stockinger et al. ............. 361/56 |

FOREIGN PATENT DOCUMENTS

| EP | 1 081 859 A1 | 3/2001 |
| JP | 55-005534 | 1/1980 |
| JP | 07-007406 | 1/1995 |

* cited by examiner

*Primary Examiner* — Jared Fureman
*Assistant Examiner* — Nicholas Ieva
(74) *Attorney, Agent, or Firm* — W. Eric Webostad (57) ABSTRACT

Enhanced electrostatic discharge ("ESD") protection for an integrated circuit is described. An embodiment relates generally to a circuit for protection against ESD. The circuit has an input/output node and a driver. The driver has a first transistor and a second transistor. A first source/drain node of the first transistor is coupled to the input/output node. A second source/drain node of the first transistor forms a first interior node capable of accumulating charge when electrically floating. A first current flow control circuit is coupled to a discharge node and the second source/drain node of the first transistor. The first current flow control circuit is electrically oriented in a bias direction for allowing accumulated charge to discharge from the first interior node via the first current flow control circuit to the discharge node.

13 Claims, 11 Drawing Sheets

ENHANCED IMMUNITY FROM ELECTROSTATIC DISCHARGE

FIELD OF THE INVENTION

The invention relates to integrated circuit devices ("ICs"). More particularly, the invention relates to enhanced electrostatic discharge ("ESD") protection for an IC.

BACKGROUND OF THE INVENTION

As is known, structures have been incorporated into ICs to make IC devices less sensitive to ESD events. However, as the size of transistors decreases, conventional ESD protection circuits may be less likely to provide sufficient protection. ESD protection circuits may in some instances negatively impact circuit performance. However, some IC devices have enhanced performance at the expense of ESD protection levels.

Accordingly, it would be desirable and useful to provide enhanced ESD protection levels with little to no impact on IC device performance.

SUMMARY OF THE INVENTION

One or more embodiments generally relate to enhanced electrostatic discharge ("ESD") protection for an integrated circuit.

An embodiment relates generally to a circuit for protection against ESD. The circuit has an input/output node and a driver. The driver has a first transistor and a second transistor. A first source/drain node of the first transistor is coupled to the input/output node. A second source/drain node of the first transistor forms a first interior node capable of accumulating charge when electrically floating. A first current flow control circuit is coupled to a discharge node and the second source/drain node of the first transistor. The first current flow control circuit is electrically oriented in a bias direction for allowing accumulated charge to discharge from the first interior node via the first current flow control circuit to the discharge node.

In one or more other embodiments of the circuit for protection against ESD, one or more of the following aspects may be included. The discharge node is the input/output node; the accumulated charge is a positive charge accumulation; and the bias direction is a forward-bias direction. The discharge node is a supply voltage node; the accumulated charge is a positive charge accumulation; and the bias direction is a forward-bias direction. The discharge node is a ground voltage node; the accumulated charge is a negative charge accumulation; and the bias direction is a negative-bias direction. The discharge node is the input/output node; the accumulated charge is a negative charge accumulation; and the bias direction is a negative-bias direction. A first source/drain node of the second transistor may be coupled to the input/output node; a second source/drain node of the second transistor may form a second interior node capable of accumulating positive charge when electrically floating; a second current flow control circuit may be coupled in parallel with the first source/drain node and the second source/drain node of the second transistor; and the second current flow control circuit may be electrically oriented in a forward-bias direction for allowing positive charge accumulation to discharge from the second interior node to the input/output node. The first current flow control circuit may be a first diode; and the second current flow control circuit may be a second diode.

Another embodiment relates generally to another circuit for protection against ESD. An input/output block of the circuit has an input/output node and a driver. The driver has a first transistor and a second transistor. A first source/drain node of the first transistor is coupled to the input/output node. A second source/drain node of the first transistor forms a first interior node capable of accumulating negative charge when electrically floating. A first current flow control circuit is coupled to the first source/drain node of the first transistor and to a ground node. The first current flow control circuit is electrically oriented in a reverse-bias direction for allowing negative charge accumulation to discharge from the first interior node to the ground node.

In one or more other embodiments of the other circuit for protection against ESD, one or more of the following aspects may be included. A first source/drain node of the second transistor may be coupled to the input/output node; a second source/drain node of the second transistor may form a second interior node capable of accumulating positive charge when electrically floating; a second current flow control circuit may be coupled to the first source/drain node of the second transistor and to a supply voltage node; and the second current flow control circuit may be electrically oriented in a forward-bias direction for allowing positive charge accumulation to discharge from the second interior node to the supply voltage node. The first current flow control circuit may be a first diode; and the second current flow control circuit may be a second diode. The first current flow control circuit may be a third transistor coupled to operate like a diode; and the second current flow control circuit may be a fourth transistor coupled to operate like a diode. The driver may be a Low Voltage Differential Signaling driver. The driver may be a single-ended driver. The input/output block may be of a Programmable Logic Device.

Yet another embodiment relates to an ESD circuit for protection against Charge Device Model ("CDM") ESD. An input/output block of the circuit has an input/output node, a first driver, and a second driver. Each of the first driver and the second driver has a first PMOS transistor, a second PMOS transistor, a first NMOS transistor, and a second NMOS transistor. Each of the first driver and the second driver is configured as described herein: the first PMOS transistor and the second PMOS transistor are connected in source-to-drain series at a first interior node therebetween. The first NMOS transistor and the second NMOS transistor are connected in drain-to-source series at a second interior node therebetween. The first PMOS transistor and the first NMOS transistor are connected in drain-to-drain series at the input/output node. Each of the first interior node and the second interior node is capable of accumulating charge when electrically floating. The input/output node is connected to an input/output pad of an integrated circuit device. A source node of the second PMOS transistor is coupled to a supply voltage line. A source node of the second NMOS transistor is coupled to a ground voltage line. A first current flow control circuit is connected either between the input/output node and the first interior node or between the first interior node and the ground voltage line. The first current flow control circuit is electrically oriented in a reverse-bias direction for allowing negative charge accumulation to discharge from the first interior node to the ground voltage line. A second current flow control circuit is connected either between the input/output node and the second interior node or between the second interior node and the supply voltage line. The second current flow control circuit is electrically oriented in a forward-bias direction for allowing positive charge accumulation to discharge from the second interior node to the supply voltage line.

In one or more other embodiments of the ESD circuit for protection against CDM ESD, one or more of the following aspects may be included. The first current flow control circuit of each of the first driver and the second driver may be a first diode; and the second current flow control circuit of each of the first driver and the second driver may be a second diode. The first current flow control circuit of each of the first driver and the second driver may be a first transistor coupled to operate like a diode; and the second current flow control circuit of each of the first driver and the second driver may be a second transistor coupled to operate like a diode. A first diode may be coupled to the supply voltage line and connected to the input/output node for allowing current flow from the input/output node to the supply voltage line and for blocking current flow from the supply voltage line to the input/output node; and a second diode may be coupled to the ground voltage line and connected to the input/output node for allowing current flow to the input/output node from the ground voltage line and for blocking current flow to the input/output node from the supply voltage line, wherein the first diode and the second diode may be for Human Body Model ESD. The first driver may be a Low Voltage Differential Signaling ("LVDS") driver; and the second driver may be a single-ended driver. The input/output block may be of a Programmable Logic Device.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 1:
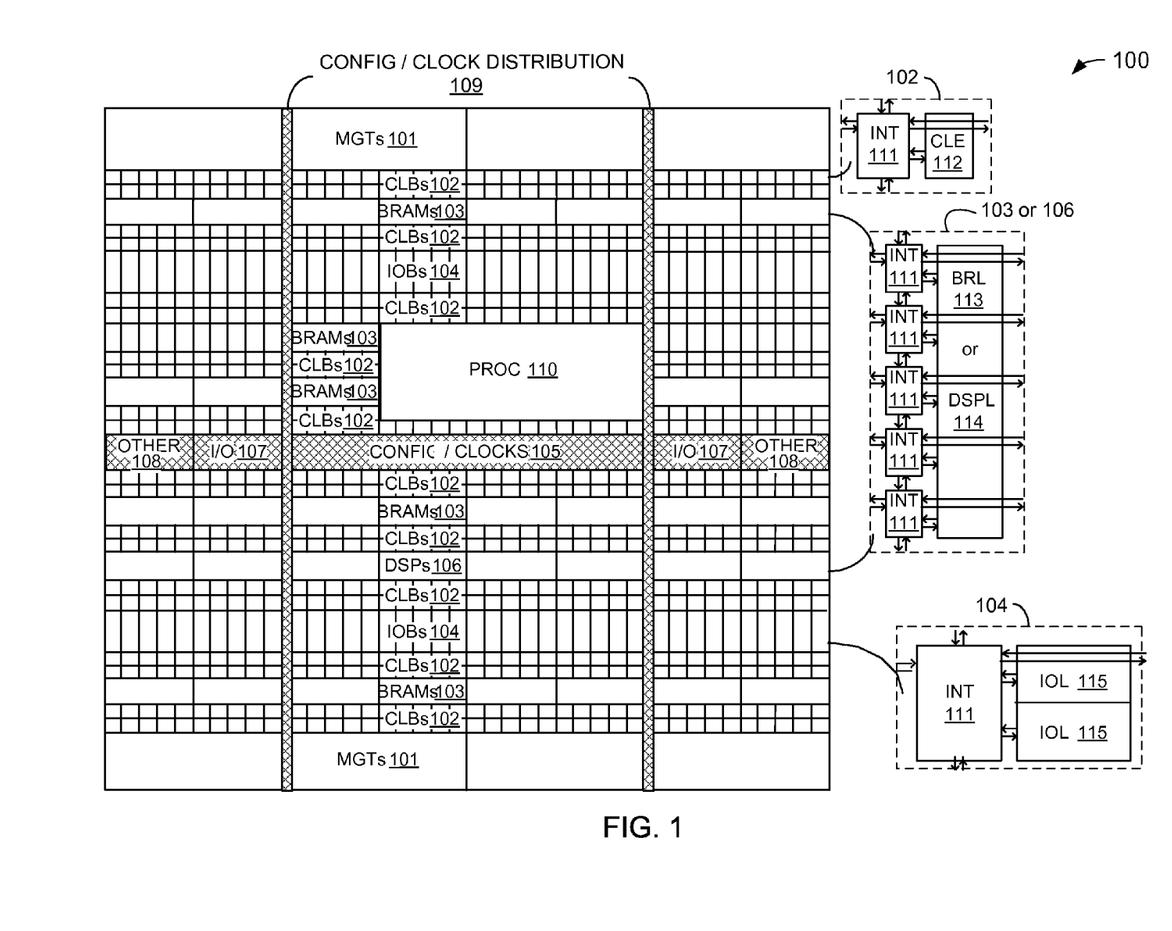
FIG. 1 is a simplified block diagram depicting an exemplary embodiment of a columnar Field Programmable Gate Array ("FPGA") architecture in which one or more aspects of the invention may be implemented.

Advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a horizontal column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

Figure 2A:
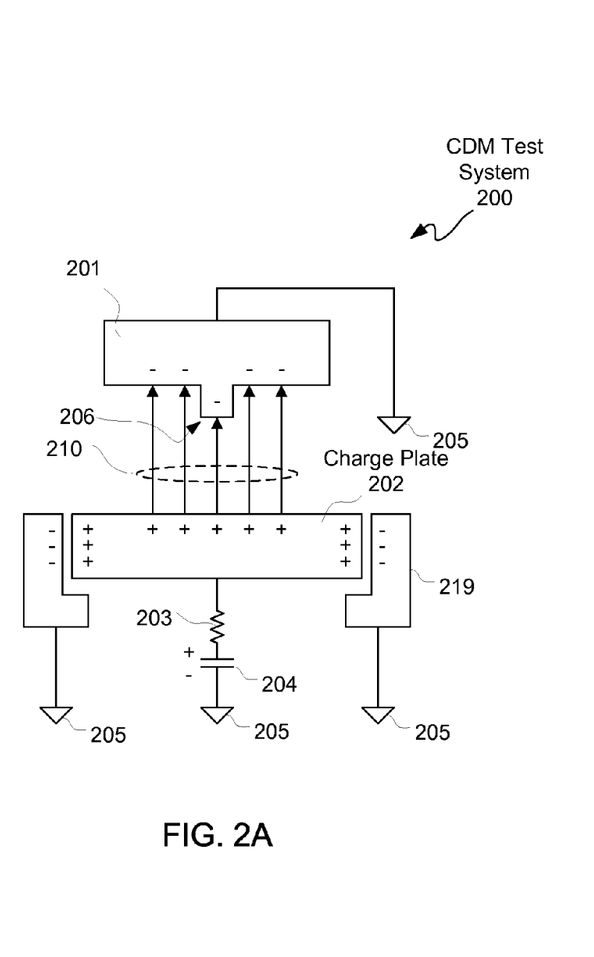
FIG. 2A is a block diagram depicting an exemplary embodiment of a Change Device Model ("CDM") test system.

FIG. 2A is a block diagram depicting an exemplary embodiment of a Change Device Model ("CDM") test system 200. CDM test system 200 includes a probe plate 201 and a charge plate 202. Charge plate 202 may be coupled to a resistor 203 in series with a voltage source 204. Voltage source 204 may be in a range of approximately 200 to 300 volts and resistor 203 may be approximately one mega ohm; however, other values for resistor 203 and voltage source 204 may be used. As CDM test system 200 is well known, it is not described in unnecessary detail. It should be understood that charge plate 202 in CDM test system 200 may be charged to a positive or a negative potential. For purposes of clarity by way of example and not limitation, charge plate 202 is described herein as being charged to a positive potential. Likewise, probe plate 201 is described for purposes of clarity by way of example and not limitation as being coupled to ground 205. Ring 219 associated with charge plate 202 is coupled to ground 205. Probe plate 201 includes a probe pin 206, which may be referred to as a "pogo" probe pin. Accordingly, the presence of probe plate 201 in near proximity to charge plate 202 with charge plate 202 being at a positive potential and probe plate 201 being coupled to ground 205 produces an electrostatic field ("E-field") 210 as generally indicted by arrows. Probe plate 201 is alternatively referred to as a "pogo pin plate."

Figure 2B:
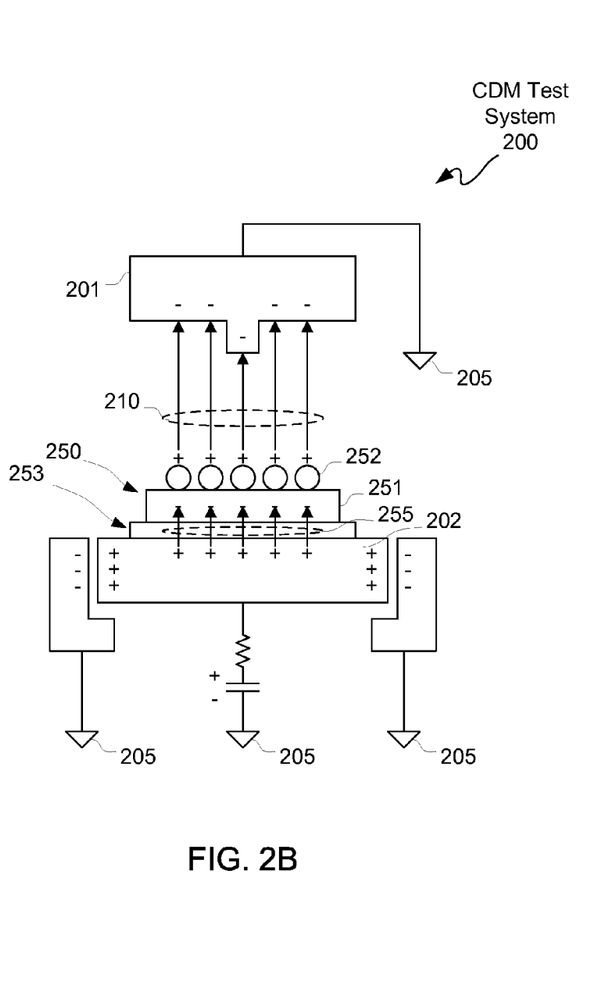
FIG. 2B is the block diagram of FIG. 2A with a device under test ("DUT").

FIG. 2B is the block diagram of FIG. 2A with a device under test ("DUT") 250. DUT 250 may be an IC chip. Such an IC chip 250 may be a semiconductor die 251 connected to a ball grid array ("BGA") or balls 252. Even though package balls are shown for purposes of clarity by way of example, it should be understood that any conductive interface, whether pins, balls, or other conductive interface, may be used. Additionally, a dielectric interface or interposer 253 may be placed between a bottom surface of IC die 251 and a top surface of charge plate 202 to form a capacitive coupling field 255.

It should be understood that DUT 250 is neutral, namely charges are separated when placed into CDM test system 200. Thus, charge plate 202 which is charged to a positive potential induces charge in DUT 250. Electrons (i.e., negative charge) are thus drawn for association with positive charge of charge plate 202 as generally indicated. Again, because DUT 250 is neutral, E-field 210 exists between positively charged balls 252 and pogo pin plate 201. Accordingly, it should be appreciated that the positive charge induced onto balls 252 from charge plate 202 is facilitated by a grounded pogo pin plate 201. Furthermore, it should be understood that at least some portion of balls 252 are connected to IOBs, or more particularly IOB pads (not shown in FIG. 2B), of IC die 251 of DUT 250.

Figure 3A:
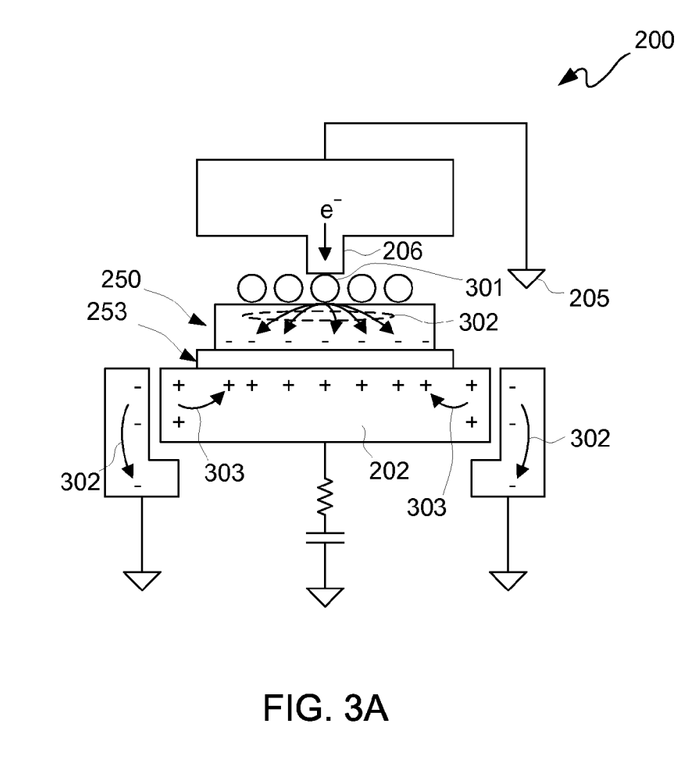
FIGS. 3A and 3B are block diagrams depicting respective exemplary embodiments of CDM currents.
Figure 3B:
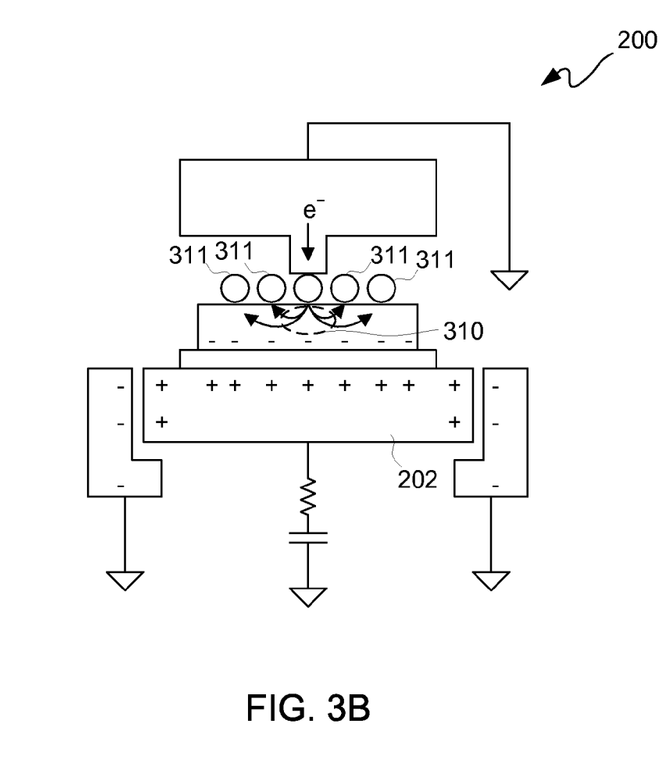

FIGS. 3A and 3B are block diagrams depicting respective exemplary embodiments of CDM currents. With reference to FIG. 3A, CDM test system 200 has a pogo pin 206 in contact with a ball 301. Because pogo pin 206 is connected to ground 205, electrons "e$^-$" propagate towards the bottom of DUT 250 to compensate for additional positive charge in charge plate 202. Arrows 302 generally indicate the direction of movement of electrons, and arrows 303 generally indicate what for purposes of clarity is referred to as the movement of holes.

Accordingly, it should be understood that charge is redistributed in charge plate 202, such that a positive potential builds up opposite a negative potential of DUT 250 as separated by dielectric interposer 253. This redistribution of charge in charge plate 202 is due to repositioning of ground from an E-field potential 210 to direct contact, namely contact of pogo pin 206 with ball 301. Even though direct contact of pogo pin 206 and ball 301 is illustratively depicted, it should be understood that as the space between pogo pin 206 and ball 301 is sufficiently small, such charge redistribution occurs due to E-field strength and arc between pogo pin 206 and a ball 252. Furthermore, it should be appreciated that the potential across dielectric interposer 253, namely the separation of charges where negative charge accumulates along a bottom region of DUT 250 and positive charge accumulates along a top region of charge plate 202, forms a capacitance across dielectric interposer 253.

With reference to FIG. 3B, arrows 310 generally indicate movement of electrons. More particularly, electrons propagate toward packaged balls 311 to compensate for additional positive charge accumulation in charge plate 202. Accordingly, it should be appreciated that CDM currents, as generally indicated by the direction of electron propagation, propagate both in IC die circuitry and in a substrate thereof.

Figure 4A:
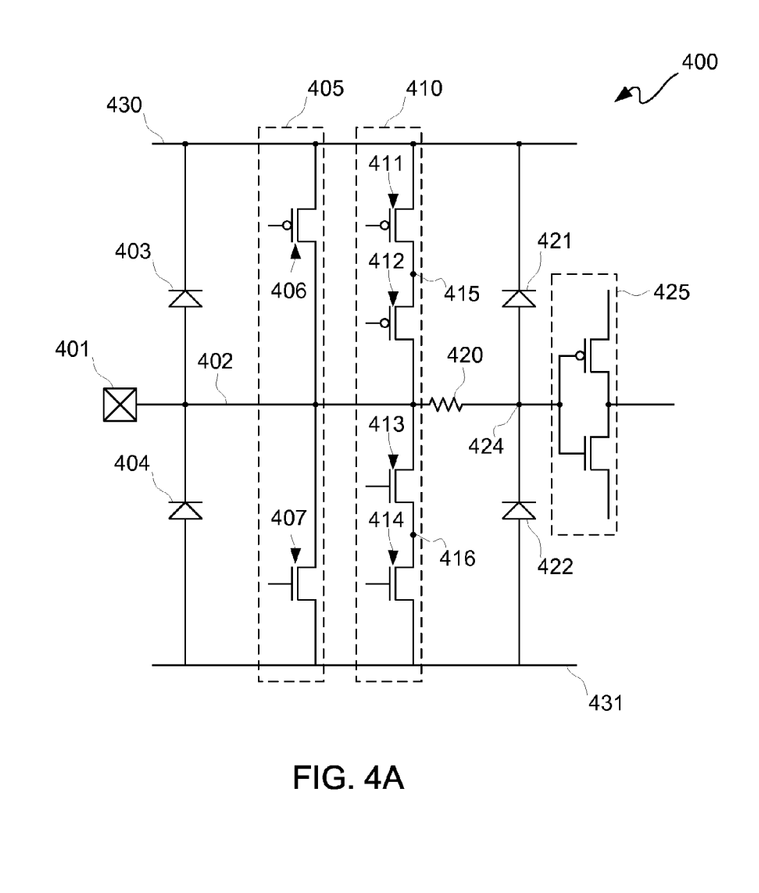
FIG. 4A is a circuit diagram depicting an exemplary embodiment of an input/output block ("IOB").

In order to have a more thorough understanding of enhanced CDM protection as described below in additional detail, a more detailed description of IOB circuitry, in general, is provided. Along those lines, FIG. 4A is a circuit diagram depicting an exemplary embodiment of an IOB 400. In IOB 400, I/O pad 401 is coupled to I/O node 402. A human body model ("HBM") diode 403 and HBM diode 404 are connected to I/O node 402. An input end of diode 403 is connected to I/O node 402 and an output end of diode 403 is connected to supply voltage line 430. For purposes of clarity, input and output ends of a diode refer to substantially non-current limiting direction.

An input end of diode 404 is connected to ground voltage line 431, and an output end of diode 404 is connected to I/O node 402. Generally, HBM diodes have a large area or perimeter for protecting against HBM ESD events, as well as for discharging CDM and machine model ("MM") ESD events. Accordingly, diodes 403 and 404 were for protection of one or more drivers of an IOB against HBM, CDM, and MM ESD events. For example, either or both a single-ended driver circuit 405 and a Low Voltage Differential Signaling ("LVDS") driver circuit 410 may be present in an IOB 400. For purposes of clarity by way of example and not limitation, it shall be assumed that both drivers 405 and 410 are part of IOB 400.

Single-ended driver circuit 405 includes PMOS pull-up transistor 406 and NMOS pull-down transistor 407. Transistors 406 and 407 are connected in drain-to-drain series at input node 402. The source of PMOS transistor 406 is connected to supply voltage line 430 and a source of transistor 407 is connected to ground voltage line 431.

LVDS driver circuit 410 includes transistors 411 through 414. PMOS transistors 411 and 412 are coupled in drain-to-source series at interior node 415. A source of PMOS transistor 411 is connected to supply voltage line 430 and a drain of PMOS transistor 412 is connected to I/O node 402. Also connected to I/O node 402 is a drain of NMOS transistor 413. NMOS transistors 413 and 414 are coupled in source-to-drain series at interior node 416. NMOS transistor 414 has a source connected to ground voltage line 431. LVDS driver circuit 410, like single-ended driver circuit 405, is protected or behind HBM diodes 403 and 404. For additional protection against CDM ESD events, a CDM resistor 420 and CDM diodes 421 and 422 may follow drivers within IOB 400.

One end of resistor 420 is connected to I/O node 402 and another end of resistor 420 is connected to input node 424 of, for example, an input driver 425. An output end of CDM diode 422 is connected to input node 424, and an input end of CDM diode 422 is connected to ground voltage line 431. An input end of CDM diode 421 is connected to input node 424, and an output end of CDM diode 421 is connected to supply voltage line 430. CDM resistor 420 and CDM diodes 421 and 422 are generally for protection of input gates 425 from CDM ESD events.

Placing resistor 420 in series from input/output pad 401 to an input node 424 of input gates 425 facilitates CDM protection. However, resistor 420 adversely affects performance of IOB 400. Accordingly, resistor 420 may not be an option in high-performance IOBs, namely IOBs that operate with frequencies at or above 1 GHz. Furthermore, for transistors, such as for LVDS driver 410 or single-ended driver 405, formed with 65 nm or less lithography, IOB 400 may not have sufficient CDM protection, which may result in yield loss during packaging and handling of an IC chip.

While not wishing to be bound by theory, it should be understood that in a transmit mode, LVDS driver circuit 410 formed using 65 nm or smaller lithography may be subject to CDM ESD failure due to charge buildup at either or both interior nodes 415 and 416. It should be appreciated that interior nodes 415 and 416 in a nonoperational mode of IOB 400 may be electrically floating. Furthermore, it should be appreciated that interior nodes 415 and 416 are relatively close to being directly connected to I/O node 402 or I/O pad 401. Only a semiconductive channel of PMOS transistor 412 separates interior node 415 from having direct electrical continuity with I/O node 402, and only a semiconductive channel of NMOS transistor 413 prevents interior node 416 from being in direct electrical continuity with I/O node 402. For LVDS driver circuit 410 formed using deep submicron lithography where the length of a channel is approximately 0.04 microns or less, CDM voltage, such as voltage from voltage supply 204 of CDM test system 200 or other CDM voltage, may cause charge to propagate across drain-source isolation of either or both transistors 412 and 413 for accumulation at interior nodes 415 and 416, respectively. Such accumulated charge may lead to CDM ESD sensitivity and potentially yield loss.

As described below in additional detail, CDM discharge paths for accumulated charge at interior nodes 415 and 416 are provided to enhance protection against CDM ESD events.

Figure 4B:
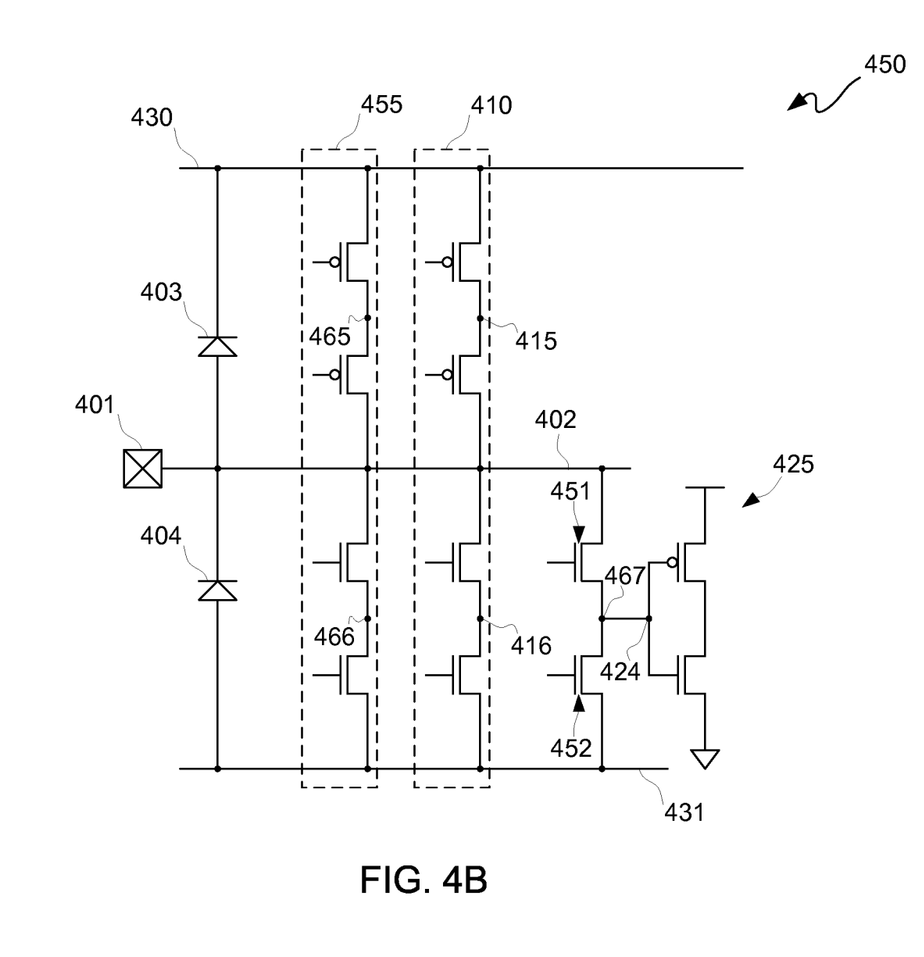
FIG. 4B is a circuit diagram depicting an exemplary embodiment of another IOB configured for high-voltage tolerance.

With reference to FIG. 4B, there is shown a circuit diagram depicting an exemplary embodiment of an IOB 450. IOB 450 is configured for high-voltage tolerance. More particularly, between I/O node 402 and ground voltage line 431 are NMOS transistors 451 and 452 coupled in source-to-drain series at an interior node 467. A drain of NMOS transistor 451 is coupled to I/O node 402, and a source of NMOS transistor 452 is coupled to ground voltage line 431. An input node 424 of input driver 425 is the same node as node 467.

A difference between IOB 450 of FIG. 4B and IOB 400 of FIG. 4A is that single-ended driver circuit 455 of IOB 450 is configured more closely with LVDS driver circuit 410 than was driver circuit 405 of FIG. 4A, namely with a series pair of PMOS transistors and a series pair of NMOS transistors. Along those lines, single-ended driver circuit 455 includes interior nodes 465 and 466 respectively corresponding to interior nodes 415 and 416. Accordingly, interior nodes 465, 466, and 467 are all source/drain disconnected from other p-n junctions, namely are internal nodes which may be subject to being electrically floating. Thus, internal nodes 415 and 416 of cascoded LVDS driver circuit 410 are source/drain disconnected from other p-n junctions, as are internal nodes 465 and 466 of single-ended driver circuit 455.

During CDM testing, positive charge may be trapped or otherwise accumulated at such NMOS disconnected junctions and negative charge may be trapped or otherwise accumulated at PMOS disconnected junctions. In other words, positive charge may be trapped at interior nodes 416, 466, and 467, or some subset thereof, and negative charge may be trapped at either or both of interior nodes 415 and 465.

Figure 5A:
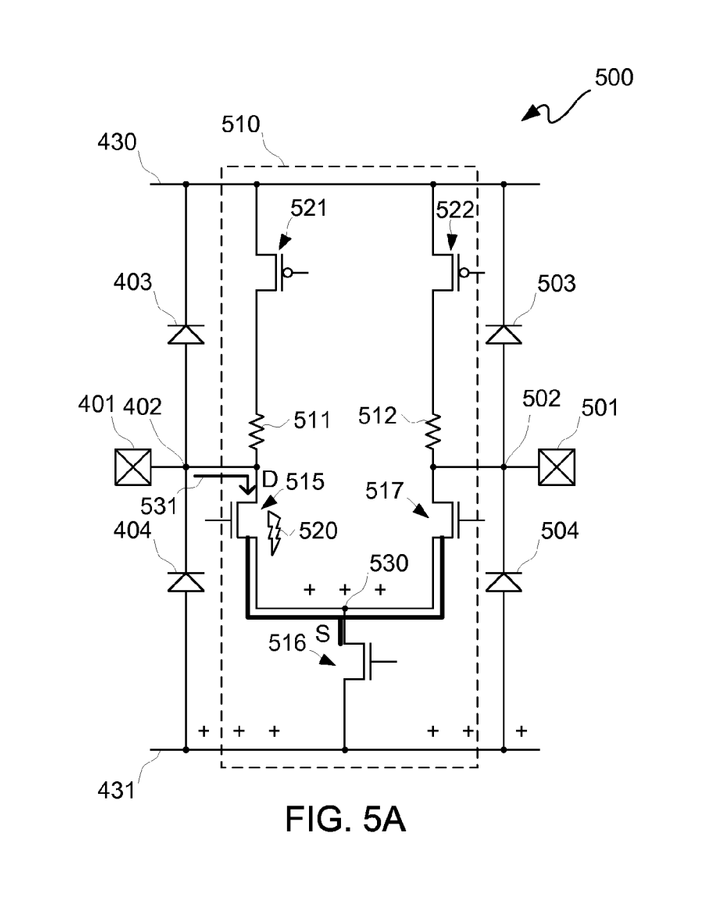
FIG. 5A is a circuit diagram depicting an exemplary embodiment of yet another IOB configured for differential signaling.

FIG. 5A is a circuit diagram depicting another exemplary embodiment of an IOB 500. IOB 500 is configured for differential signaling, namely has a differential driver circuit 510, an I/O pad 401, and an I/O pad 501. Differential driver circuit 510 is formed of resistors 511 and 512, PMOS transistors 521 and 522, and NMOS transistors 515 through 517. I/O pad 501 is coupled to I/O node 502 corresponding to I/O node 402. Likewise, HBM diodes 503 and 504, which respectively correspond to HBM diodes 403 and 404 as associated with I/O pad 401 of IOB 500, are associated with I/O pad 501.

I/O node 402 is coupled to one end of resistor 511, and another end of resistor 511 is coupled to a drain of PMOS transistor 521. A source of PMOS transistor 521 is coupled to supply voltage line 430. Likewise, an end of resistor 512 is connected to I/O node 502, and another end of resistor 512 is connected to a drain of PMOS transistor 522. A source of PMOS transistor 522 is connected to supply voltage line 430. NMOS transistors 515 through 517 provide a current source of differential driver circuit 510.

A drain of NMOS transistor 515 is connected to I/O node 402, and a source of NMOS transistor 515 is connected to a drain of transistor 516 at internal node 530. A drain of NMOS transistor 517 is connected to I/O node 502, and a source of NMOS transistor 517 is connected to a drain of transistor 516 at internal node 530. A source of NMOS transistor 516 is connected to ground voltage line 431. Accordingly, it should be appreciated that a channel of NMOS transistor 516 provides a virtual ground path from ground voltage line 431 to current source transistors 515 and 517.

When I/O pad 401 is coupled to ground, whether in direct contact or with sufficient E-field strength, electrons may be provided to a drain of transistor 515, which is generally indicated with a D for purposes of clarity. Electrons provided to drain D as generally indicated at arrow 531 cause an accumulation of positive charge at a source node 530, as generally indicated with a thick black line and an S. Furthermore, such providing of electrons by grounding of I/O pad or pin 401 may promote an accumulation of positive charge in association with ground voltage line 431.

The differential or potential across a channel, such as across a channel of either or both transistor 515 or transistor 517 may cause ESD-induced channel damage by CDM ESD, such as generally indicated by bolt 520 associated with transistor 515 for example.

Figure 5B:
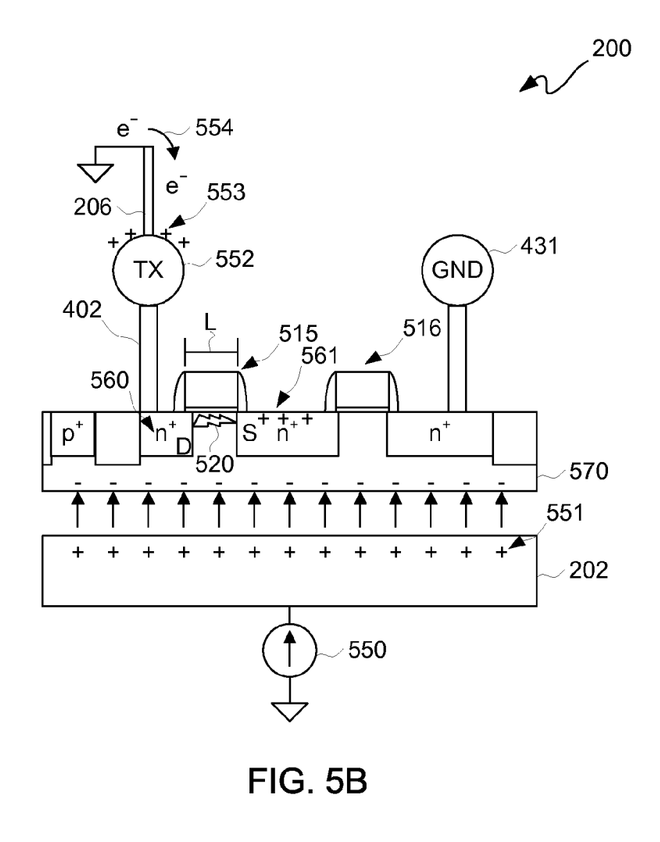
FIG. 5B is a cross-sectional view depicting an exemplary embodiment of a portion of the IOB of FIG. 5 in the CDM test system of FIG. 2.

FIG. 5B is a cross-sectional view depicting an exemplary embodiment of a portion of IOB 500 in CDM test system 200. With reference to FIGS. 2 and 5A, portion of IOB 500 of FIG. 5B is further described. Current source 550 is associated with resistor 203 and voltage source 204, and as previously described may be for voltages equal to or in excess of approximately 200 volts. Thus, current provided to charge plate 202 causes a positive potential 551. A DUT 250 with IOB 500 in CDM test system 200 remains neutral because charges are redistributed: positive potential 553 forms on a one side, which in the depicted embodiment is an upper side, of ball 552 and on an upper portion of isolated diffusion region 561, while electrons are accumulated at in a lower portion of substrate 570 facing CDM table 202. When a ball or other contact 552, such as connected to I/O pad 401 of an IC, is grounded, via pogo pin 206, electrons or current as generally indicated by arrow 554 flow to a drain diffusion region 560. Even though doping indications such as n+ and p+ are generally indicated for regions within substrate 570, it should be understood that other configurations may be used in accordance with the scope of this disclosure. For purposes of correspondence with FIG. 5A, in FIG. 5B a D is used to indicate the drain region of transistor 515, a source region, as denoted with an S, of transistor 515 is likewise indicated.

For channel length L of transistor 515 being on the order of 0.4 microns or less, potential for channel damage as generally indicated by bolt 520 by one or more CDM ESD events is possible with voltages as little as 150 volts. Thus, for passing a CDM test, a MOS transistor channel, such as of transistor 515 for example, should be able to pass with a specified voltage applied to charge plate 202.

For an NMOS transistor 515, during a CDM ESD discharge, ground potential delivered via a pogo pin 206 to node 402 via a ball 552 connected to an I/O pad 401 creates a high voltage drop across a channel of NMOS transistor 515. This is due to a relatively high potential between a disconnected source/drain diffusion region 561 and a diffusion region or node 560 connected to I/O node 402. More particularly, positive charge accumulates in diffusion region 561, namely a source region of NMOS transistor 515. Such accumulation of charge is due to a potential well of a reverse-bias p-n junction which causes positive charge trapping in diffusion region 561.

As described below in additional detail, a discharge path is provided to leak stored positive charge from NMOS internal nodes, namely nodes capable of electrically floating for NMOS devices. Likewise, negative charges may build up in diffusion regions of PMOS devices, where such diffusion regions are capable of electrically floating, namely there is no discharge path, and thus likewise a discharge path is provided to leak stored negative charge from PMOS internal nodes.

Figure 6:
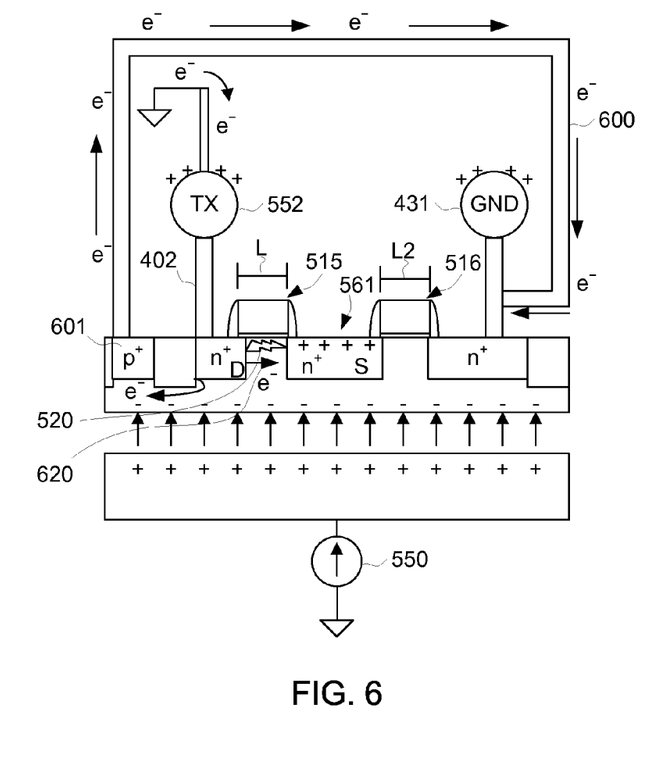
FIG. 6 is the cross-sectional view of FIG. 5B except a conductive path is added.

FIG. 6 is the cross-sectional view of FIG. 5B except a conductive path 600 is added. More particularly, conductive path 600 goes from ground voltage line 431 to p-type diffusion region 601. P-type diffusion region 601 is a p-type region of an HBM diode such as HBM diode 403. In this configuration, positive charges on ground voltage line 431 are compensated with electrons via path 600. In this configuration where I/O pads 401 and 501 are transmission pads, "snap-back" due to electron injection or punch-through of a channel of transistor 515 may cause a failure as generally indicated by bolt 520. Furthermore, punch-through may occur through a gate oxide of transistor 515. Such MOS damage may be due to a voltage drop from an I/O node 402 connected to a grounded I/O pad 401 and a source diffusion region 561 which is electrically disconnected or otherwise floating with respect to other p-n junctions. Such electron injection or punch-through is generally indicated by arrow 620.

It should be understood that, though not shown as significantly different in FIG. 6, the channel length L of transistor 515 compared to the channel length L2 of transistor 516 may be an order of magnitude or more different. For example, for channel length L of transistor 515 being on the order of approximately 0.04 microns and for channel length L2 of transistor 516 being on the order of 0.12 microns, transistor 516 is significantly less susceptible to a CDM ESD-induced failure.

Figure 7:
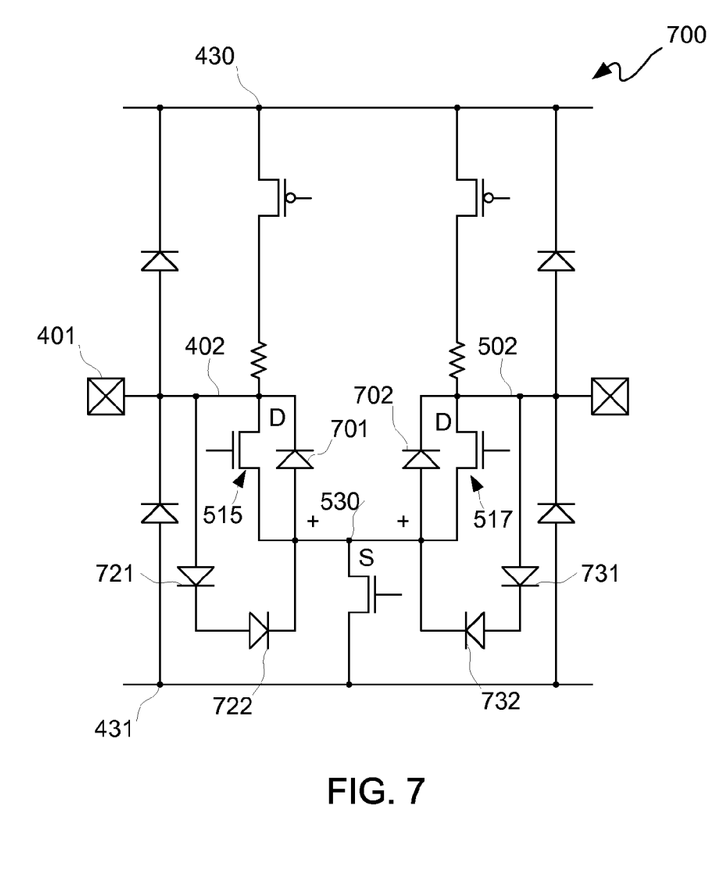
FIG. 7 is a circuit diagram depicting an exemplary embodiment of a differential driver circuit with enhanced CDM ESD protection.

FIG. 7 is circuit diagram depicting an exemplary embodiment of a differential driver circuit 700 with enhanced CDM ESD protection. Differential driver circuit 700 is differential driver circuit 500 of FIG. 5 with the addition of diodes 701, 702, 721, 722, 731, and 732. Generally, an input end of diode 701 is coupled to a source node 530 at an input end of diode 701. An output end of diode 701 is connected to I/O node 402. Accordingly, for I/O pad 401 being a transmission driver, diode 701 shunts a channel of NMOS transistor 515. Thus, if positive charge builds up or otherwise is accumulated in a source diffusion region of transistor region 515, diode 701 discharges such positive accumulated charge to I/O node 402, namely a conductive path to ground via I/O pad 401. In this configuration, diode 701 in conducting positive charge is in a forward-biased configuration.

Likewise, diode 702 is connected to shunt a channel region of NMOS transistor 517. As the same description or similar description applies to shunting of a channel of NMOS transistor 517 with diode 702 as already described with reference to diode 701 and NMOS transistor 515, such description is not repeated. By shunting NMOS transistors 515 and 517 respectively with forward-biased diodes 701 and 702, protection against CDM ESD events is enhanced.

In other words, by providing discharge paths via diode 701 and 702 to leak stored positive charge from source diffusion regions associated with transistors 515 and 517, stored positive charge leakage makes source nodes of transistors 515 and 517 neutral during such discharge. This removes the detrimental voltage drop previously described, and thus enhances CDM ESD protection of transistors 515 and 517 at their disconnected source nodes, which likewise applies to electrically disconnected drain nodes for PMOS transistors and leakage of accumulated negative charge.

Optionally, one or more diodes, such as diodes 721 and 722, may be coupled in series for electrically shunting transistor 515 in the opposite polarity direction. In other words, I/O node 402 may be coupled to a p-type region of diode 721; an n-type region of diode 721 may be connected to a p-type region of diode 722; and an n-type region of diode 722 may be connected to source node 530. Negative charge at node 402 thus may flow through diodes 721 and 722 in a reverse-bias direction for further electrically neutralizing the channel of transistor 515. Likewise, one or more of transistors 731 and 732 may be coupled in series to shunt a channel region of transistor 517 in a reverse-bias direction from I/O node 502 to source node 530. Again, though this description is for shunting NMOS, such description applies to shunting of PMOS.

Figure 8:
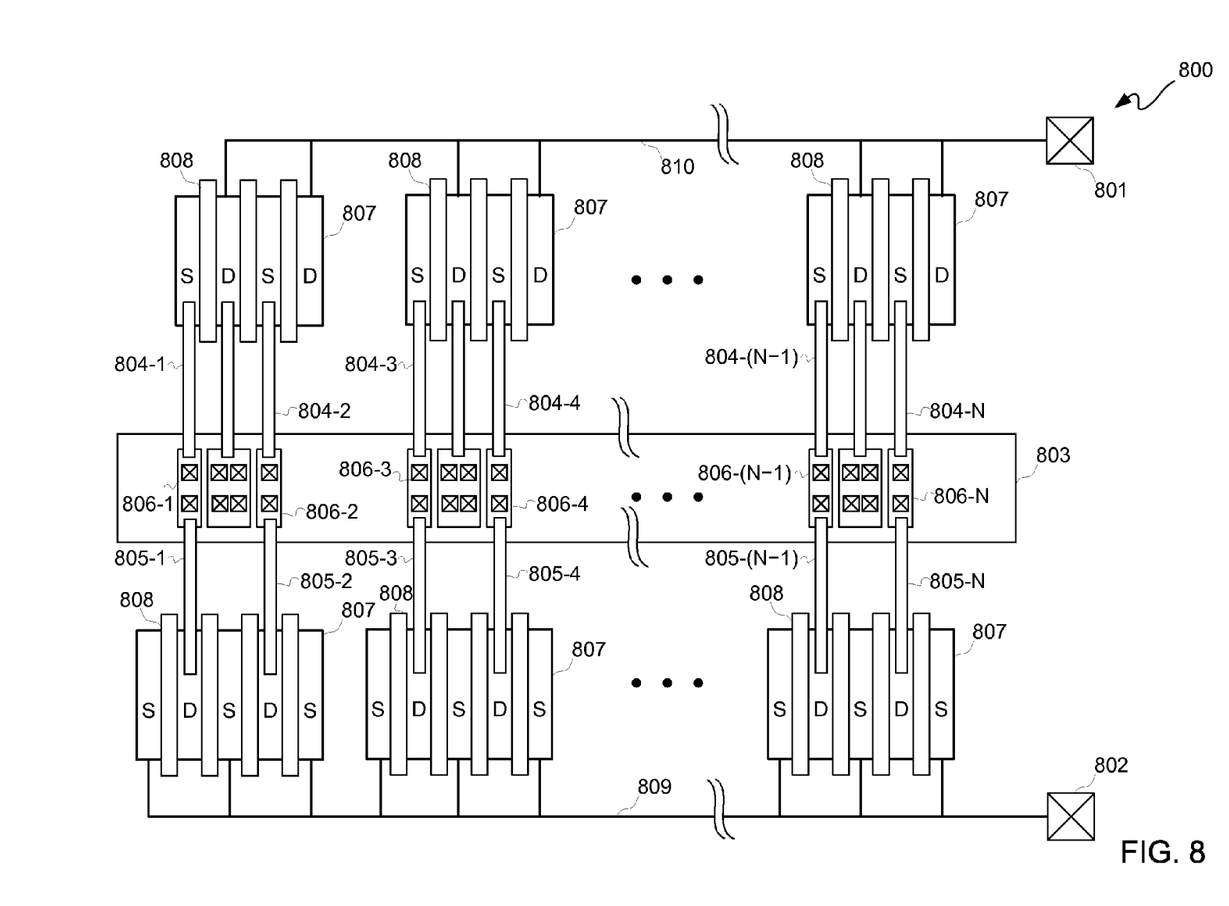
FIG. 8 is a top view depicting an exemplary embodiment of a layout for a transmit differential driver for NMOS.

FIG. 8 is a top view depicting an exemplary embodiment of diodes, such as diodes 701 and 702, as laid out with layout 800. Layout 800 is for an NMOS portion of a transmit differential driver. However, from the following description, it will be understood that a PMOS portion of a transmit differential driver may similarly be laid out.

Gates 808 form transistors in active areas 807 A transmit I/O pad 801 has a bus 810 with contacts to drain regions as indicated by Ds associated with active areas 807. A grounded pad 802 is associated with a ground bus 809 which has contacts to source regions of active areas 807.

Top active areas 807 have contacts to drain regions and bottom active areas 807 have contacts to source regions, such that drain regions of top active areas 807 are coupled to transmit pad 801 and source regions of bottom active areas 807 are connected to ground pad 802. Between active regions 807 is located n-well 803. Shunts 804-1 through 804-N extend from source regions of transistors 515 and 517, being the upper active areas 807, to diodes 806-1 through 806-N formed in n-well 803. For purposes of clarity by way of example and not limitation, it shall be assumed that N is equal to 6; however, it should be understood that other positive integer values for N may be used. Accordingly, there are eight active areas or regions 807, such as may be defined in a semiconductor substrate.

Conductive shunts 805-1 through 805-6 are respectively connected to diodes 806-1 through 806-6 and respectively connected to drain regions of transistor 516, being the lower active areas 807. Accordingly, it should be understood that device source and drain regions are shorted with conductive shunts 804 and 805 via diodes 806, where only one diode per isolated differential pair common node is implemented. Thus, it should be understood that IOBs may be laid out with diodes as described herein for purposes of enhanced CDM ESD protection.

Figure 9A:
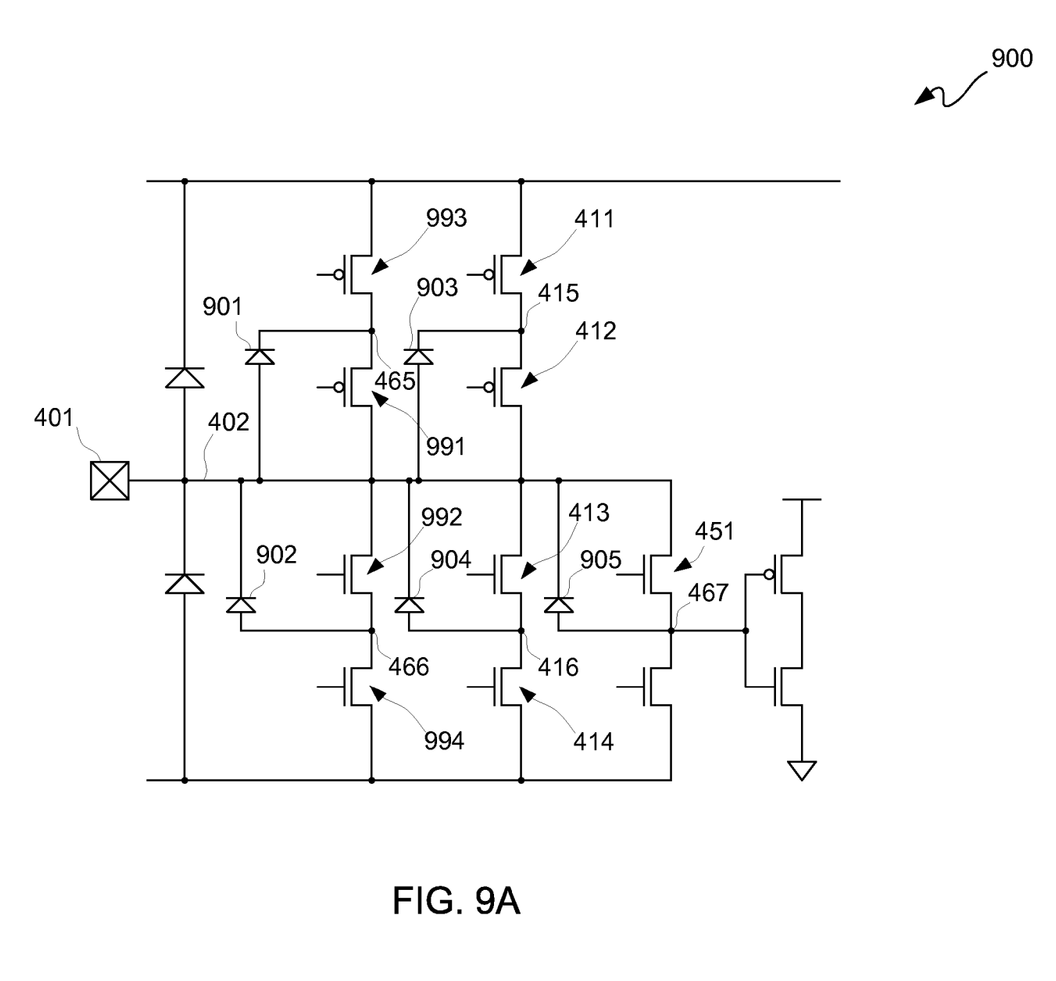
FIG. 9A is a circuit diagram depicting an exemplary embodiment of an IOB with enhanced CDM electrostatic discharge ("ESD") protection.

FIG. 9A is a circuit diagram depicting an exemplary embodiment of IOB 900 with enhanced CDM ESD protection. IOB 900 is the same as IOB 450 of FIG. 4B with the following differences. From I/O node 402 to internal node 465, there is inserted a diode 901. From internal node 466 to I/O node 402, there is inserted a diode 902. From internal node 416 to I/O node 402, there is inserted a diode 904. From I/O node 402 to internal node 415 there is inserted a diode 903. From internal node 467 to I/O node 402 there is inserted a diode 905. Diodes 902, 904, and 905 are coupled for discharge of positive charge accumulated respectively at internal nodes 466, 416, and 467. Diodes 902, 904, and 905 are coupled in a forward-biased direction for such discharge. Nodes 465 and 415, which may trap negative charge, are respectively coupled to diodes 901 and 903 in a reverse-bias direction for discharge of such negative charge.

PMOS transistors 993 and 991 are coupled in series as previously described respectively with reference to PMOS transistors 411 and 412. Likewise, transistors 992 and 994 are coupled in series as previously described respectively with reference to NMOS transistors 413 and 414. It should be understood that transistors 991 through 994 form a single-ended driver circuit. In order to protect transistors 991 and 992 from one or more CDM ESD events, diodes 901 and 902 respectively are formed. Likewise, in order to protect transistors 992, 413, and 451 from one or more CDM ESD events, diodes 902, 904, and 905, respectively, are formed.

Figure 9B:
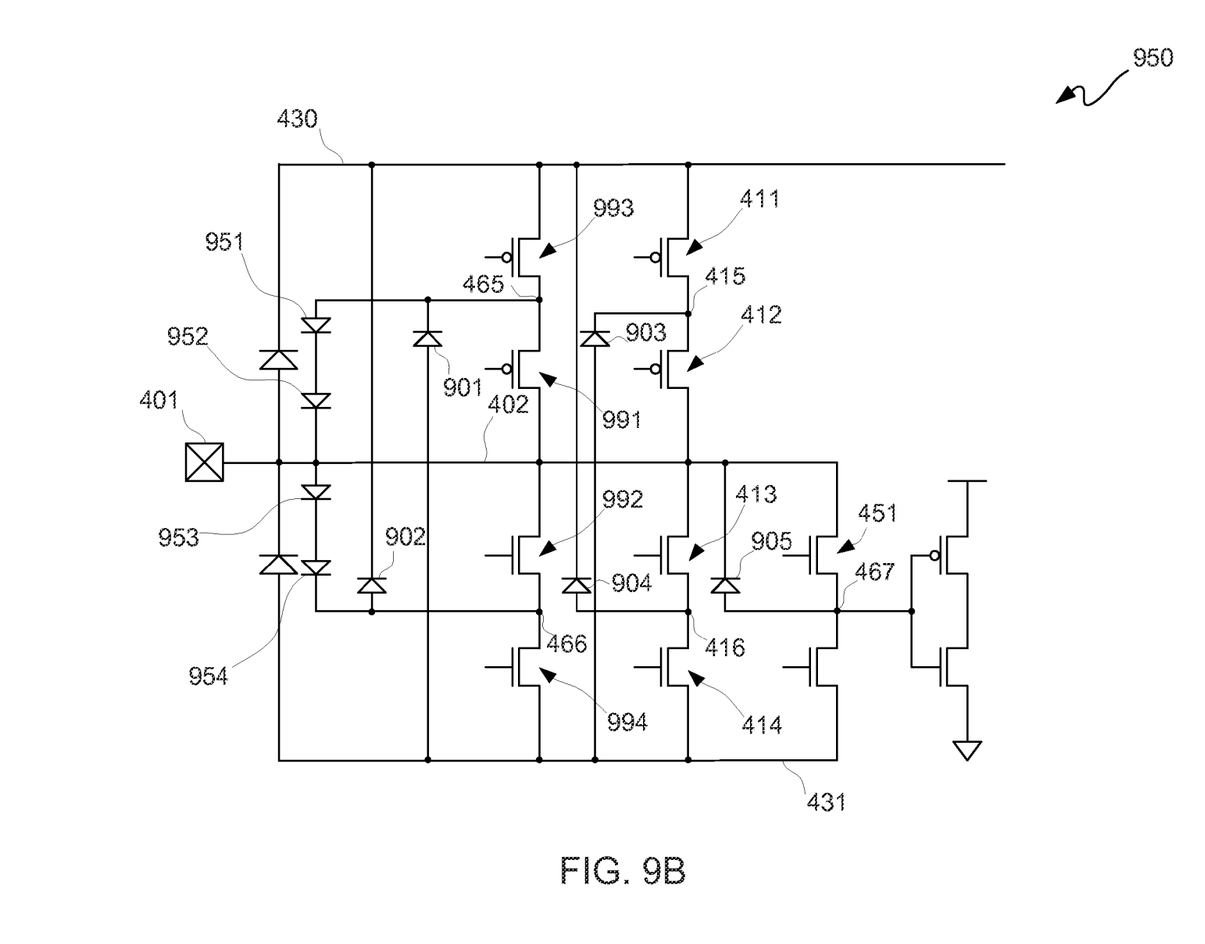
FIG. 9B is a circuit diagram depicting another exemplary embodiment of an IOB with enhanced CDM ESD protection

FIG. 9B is a circuit diagram depicting another exemplary embodiment of an IOB 950 with enhanced CDM ESD protection. IOB 950 of FIG. 9B is the same as IOB 900 of FIG. 9A, except with the following differences. Diode 901 rather than being connected to I/O node 402 is connected to ground voltage line 431. Likewise, diode 903 rather than being connected to I/O node 402 is connected to ground voltage line 431. It should be understood that the discharge path of negative charge that may be accumulated at either or both of nodes 465 and 415, which may respectively discharge in a reverse-bias direction via diodes 901 and 902 to ground voltage line 431, operates the same as in IOB 900 assuming that both I/O pad 401 and voltage ground line 431 are electrically coupled to ground.

Furthermore, in IOB 950, diode 902 instead of being connected to I/O node 402 is connected to supply voltage line 430. Likewise, diode 904 rather than being coupled to I/O node 402 is coupled to supply voltage line 430. Both diodes 902 and 904 are coupled in a forward-bias direction for respectively discharging accumulated positive charge at internal nodes 466 and 416 to supply voltage line 430. This discharge path assumes that supply voltage line 430 is coupled to a supply voltage.

Diode 905 in both IOB 900 and 950 is connected to I/O node 402. Accordingly, it should be appreciated that a combination of connecting to I/O node 402 or to either ground voltage line 431 or supply voltage line 430 may be implemented with shunting diodes in accordance with the descriptions of FIGS. 9A and 9B.

Optionally, one or more small diodes in series may be coupled to shunt an internal node to I/O node 402 in the opposite polarity direction described. More particularly, optionally, diodes 951 and 952 may be coupled in series between internal node 465 and I/O node 402. If any positive charge were to accumulate at internal node 465, and I/O pad 401 were grounded, diodes 951 and 952 may be used as a voltage clamp. It should be appreciated that diodes 951 and 952 are coupled in a forward-bias direction where positive charge would travel from internal node 465 to I/O node 402. Diodes 951 and 952 may be made sufficiently small such as to not otherwise impede operation.

Likewise, diodes 953 and 954 may optionally be coupled in series between I/O node 402 and internal node 466. Diodes 953 and 954 are coupled in a reverse-bias direction. Accordingly, for positive charge accumulated at internal node 466 for I/O pad 401 grounded, diodes 953 and 954 provide a voltage clamp. By optionally providing voltage clamps for transistors 991 and 992, those transistors are effectively made electrically neutral should a forward-bias condition occur due to positive charge accumulated at internal node 465 or a reverse-bias condition occur due to negative charge accumulated at node 466.

Even though diodes 951 and 952 are shown for protecting transistor 991 from one or more CDM ESD events and diodes 953 and 954 are illustratively shown for protecting transistor 992 from one or more CDM ESD events, it should be understood that other sets of such pairs of diodes may be used in like manner for protecting transistors 412, 413, and 451 in accordance with the previous description. Furthermore, such diodes 951 through 954 may optionally be included in IOB 900 in accordance with the previous description.

It should be understood that the insertion of diodes in association with internal nodes as described above provides a discharge path. However, it is not necessary that diodes be formed. Rather, any circuitry that does not negatively impact operation of an IOB may be used for creating a discharge path for an internal node as described herein. Even though enhanced CDM ESD associated with an IOB has been described, namely for protection of transistors which are directly connected to an I/O node, such as I/O node 402, it should be understood that in other applications such shunting devices may be connected to protect an internal node of a MOS transistor that is not directly connected to I/O node 402.

Accordingly, it should be appreciated that enhanced CDM ESD protection of MOS transistors having source or drain disconnected from other p-n junctions has been described. This protection has been described at least in part by adding discharge paths to these nodes via small diodes or any other passive device or active device capable of controlling direction of current flow.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A circuit for protection against electrostatic discharge, comprising:
   an input/output node and a driver, wherein the driver includes a first transistor and a second transistor of a same polarity coupled to one another in source-drain series at a first interior node of the driver;
   a first source/drain node of the first transistor coupled to the input/output node;
   a second source/drain node of the first transistor of the first interior node of the driver capable of accumulating charge when electrically floating; and
   a first current flow control circuit directly coupled to a discharge node and the second source/drain node of the first transistor,
   wherein the first current flow control circuit is electrically oriented in a bias direction for allowing accumulated charge to discharge from the first interior node via the first current flow control circuit to the discharge node.

2. The circuit according to claim 1, wherein:
   the discharge node is the input/output node;
   the accumulated charge is a positive charge accumulation; and
   the bias direction is a forward-bias direction.

3. The circuit according to claim 1, wherein:
   the discharge node is a supply voltage node;
   the accumulated charge is a positive charge accumulation; and
   the bias direction is a forward-bias direction.

4. The circuit according to claim 1, wherein
   the discharge node is a ground voltage node;
   the accumulated charge is a negative charge accumulation; and
   the bias direction is a negative-bias direction.

5. The circuit according to claim 1, wherein
   the discharge node is the input/output node;
   the accumulated charge is a negative charge accumulation; and
   the bias direction is a negative-bias direction.

6. The circuit according to claim 5, further comprising:
   a first source/drain node of a third transistor coupled to the input/output node;
   a second source/drain node of the third transistor forming a second interior node of the driver capable of accumulating positive charge when electrically floating;
   a second current flow control circuit coupled in parallel with the first source/drain node and the second source/drain node of the third transistor; and
   the second current flow control circuit electrically oriented in a forward-bias direction for allowing positive charge accumulation to discharge from the second interior node to the input/output node.

7. The circuit according to claim 6, wherein the first current flow control circuit is a first diode; and wherein the second current flow control circuit is a second diode.

8. The circuit according to claim 4, further comprising:
   a first source/drain node of a third transistor coupled to the input/output node;
   a second source/drain node of the third transistor forming a second interior node of the driver capable of accumulating positive charge when electrically floating;
   a second current flow control circuit directly coupled to the second source/drain node of the third transistor and to a supply voltage node; and
   the second current flow control circuit electrically oriented in a forward-bias direction for allowing positive charge accumulation to discharge from the second interior node to the supply voltage node.

9. The circuit according to claim 8, wherein the first current flow control circuit is a first diode, and wherein the second current flow control circuit is a second diode.

10. The circuit according to claim 8, wherein the first current flow control circuit is a third transistor coupled to operate like a diode, and wherein the second current flow control circuit is a fourth transistor coupled to operate like a diode.

11. The circuit according to claim 8, wherein the driver is a Low Voltage Differential Signaling driver.

12. The circuit according to claim 8, wherein the driver is a single-ended driver.

13. The circuit according to claim 8, wherein the input/output node is of an input/output block of a Programmable Logic Device.

* * * * *